United States Patent
Sakamoto et al.

(10) Patent No.: US 10,283,711 B2
(45) Date of Patent: May 7, 2019

(54) METHOD OF PRODUCING ORGANIC EL INK AND METHOD OF MANUFACTURING ORGANIC EL DEVICE

(71) Applicant: JOLED INC., Tokyo (JP)

(72) Inventors: Koyo Sakamoto, Tokyo (JP); Shinichiro Ishino, Tokyo (JP); Tomohiko Oda, Tokyo (JP); Yasuhiro Yamauchi, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/406,006

(22) Filed: Jan. 13, 2017

(65) Prior Publication Data

US 2017/0207388 A1 Jul. 20, 2017

(30) Foreign Application Priority Data

Jan. 19, 2016 (JP) .................. 2016-008191

(51) Int. Cl.

| | |
|---|---|
| *H01B 1/12* | (2006.01) |
| *H01L 51/00* | (2006.01) |
| *C09D 11/50* | (2014.01) |
| *C09D 11/52* | (2014.01) |
| *C09K 11/06* | (2006.01) |
| *H01L 51/50* | (2006.01) |

(52) U.S. Cl.
CPC .......... *H01L 51/0007* (2013.01); *C09D 11/50* (2013.01); *C09D 11/52* (2013.01); *C09K 11/06* (2013.01); *H01B 1/12* (2013.01); *H01L 51/5012* (2013.01); *H01L 51/5056* (2013.01); *H01L 51/5072* (2013.01); *H01L 51/5088* (2013.01); *H01L 51/5092* (2013.01)

(58) Field of Classification Search
CPC .......... C09D 11/50; C09D 11/52; C09K 11/06; H01L 51/0007; H01L 51/5012; H01L 51/5056; H01L 51/5072; H01L 51/5088; H01L 51/5092; H01B 1/12
See application file for complete search history.

(56) References Cited

U.S. PATENT DOCUMENTS

| | | | |
|---|---|---|---|
| 2007/0093167 A1 | 4/2007 | Ishida | |
| 2012/0049120 A1* | 3/2012 | Chen | C09D 11/10 252/301.35 |
| 2012/0059204 A1* | 3/2012 | Kurooka | C07C 7/005 570/211 |

FOREIGN PATENT DOCUMENTS

JP 2007-122914 5/2007

* cited by examiner

*Primary Examiner* — Mark Kopec
*Assistant Examiner* — Jaison P Thomas
(74) *Attorney, Agent, or Firm* — Greenblum & Bernstein, P.L.C.

(57) ABSTRACT

A method of producing an organic electroluminescent ink includes reducing ozone contained in an organic electroluminescent mixture comprising an organic electroluminescent material and a solvent.

7 Claims, 4 Drawing Sheets

METHOD OF PRODUCING ORGANIC EL INK AND METHOD OF MANUFACTURING ORGANIC EL DEVICE

CROSS REFERENCE TO RELATED APPLICATIONS

The present application is based on and claims priority of Japanese Patent Application No. 2016-0081.91 filed on Jan. 19, 2016. The entire disclosure of the above-identified application, including the specification, drawings and claims is incorporated herein by reference in its entirety.

FIELD

The techniques of the present disclosure relate to a method of producing organic electroluminescent (EL) ink and a method of manufacturing organic EL devices.

BACKGROUND

Manufacturing of organic electroluminescent (EL) devices uses a method of applying an organic EL ink into a film to form an organic functional layer. The organic EL ink and the organic EL devices including the organic EL ink will deteriorate over time. To deal with such deterioration, a variety of methods have been devised. For example, techniques are proposed in which ozone is focused as a cause to deteriorate organic EL ink, and an organic EL luminous layer is formed in a housing having an air atmosphere with an ozone concentration lower than that in the air (see PTL 1).

CITATION LIST

Patent Literature

[PTL 1] Japanese Unexamined Patent Application Publication No. 2007-122914

SUMMARY

Technical Problem

The techniques disclosed in PTL 1, however, still have difficulties in a reduction in age deterioration of organic EL ink caused by ozone, and thus organic EL devices.

The present disclosure has been made to solve these problems. An object of the present disclosure is to provide a method of producing an organic EL ink having reduced deterioration caused by ozone, and a method of manufacturing an organic EL device.

Solution to Problem

To achieve this object, a method of producing an organic EL ink according to one aspect of the present disclosure includes reducing ozone contained in an organic EL mixture comprising an organic EL material and a solvent.

Advantageous Effects

The method of producing an organic EL ink and the method of manufacturing an organic EL device in the present disclosure provide an organic EL ink and organic EL devices having reduced deterioration caused by ozone.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS

The method of producing an organic EL ink and the method of manufacturing an organic EL device according to embodiments of the present disclosure will now be described with reference to the attached drawings. The embodiments described below are illustrative as specific examples of the present disclosure. Numeric values, shapes, materials, components, positions of components arranged, forms of connection of components, steps, and order of steps described in the following embodiments are only illustrative, and should not be construed as limitation on the present disclosure. Among the components described in the following embodiments, components not described in an independent claim representing the most superordinate concept of the present invention will be described as arbitrary components.

Method of Producing Organic EL Ink

Embodiment 1

Figure 1:
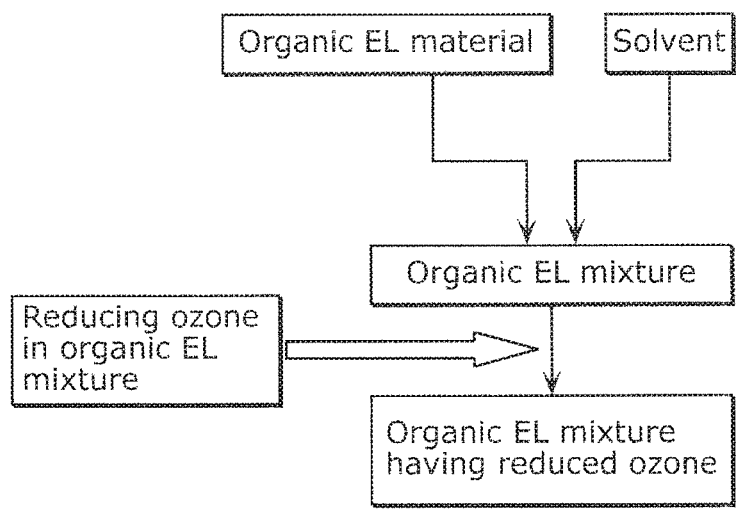
FIG. 1 illustrates a flow of a method of producing an organic EL ink according to Embodiment 1.

FIG. 1 illustrates a flow of a method of producing an organic EL ink according to Embodiment 1. As illustrated in FIG. 1, the method of producing an organic EL ink according to Embodiment 1 includes reducing ozone contained in an organic EL mixture comprising an organic EL material and a solvent.

Throughout the specification, the term "reducing ozone contained in the organic EL mixture" refers to a reduction in content of ozone in the organic EL mixture, for example.

The method of producing an organic EL ink according to Embodiment 1 can reduce ozone contained in the organic EL mixture, resulting in an organic EL ink having high quality and reduced age deterioration. Specifically, the method of producing an organic EL ink according to Embodiment 1 can produce an organic EL ink containing 0.0005 ppm or less ozone.

Examples of the step of reducing ozone contained in an organic EL mixture include a step of treating an organic EL mixture with an ozone adsorbent to reduce the ozone contained in the organic EL mixture.

Examples of the ozone adsorbent usable in the present embodiment include zeolite, silica gel, alumina, and activated carbon. These ozone adsorbents may be used alone or in the form of mixtures.

Examples of the method of treating an organic EL mixture with an ozone adsorbent include a method of treating an organic EL mixture through a column carrying an ozone adsorbent, and a method of dispersing an ozone adsorbent in an organic EL mixture once, and removing the ozone adsorbent from the organic EL mixture through filtration. The present embodiment is advantageous because the ozone contained in the organic EL mixture can be reduced by such a simple method described above.

Throughout the specification, the term "organic EL material" refers to one of materials for luminous layers, hole injection layers, electron injection layers, hole transport layers, and electron transport layers.

The material for luminous layers refers to a material contained in luminous layers of organic EL devices. Specifically, examples of the materials for luminous layers include fluorescent substances, such as F8BT (poly(9,9-di-n-octylfluorene-alt-benzothiadiazole)), oxynoid compounds, perylene compounds, coumarin compounds, azacoumarin compounds, oxazole compounds, oxadiazole compounds, perinon compounds, pyrrolopyrrole compounds, naphthalene compounds, anthracene compounds, fluorene compounds, fluoranthene compounds, tetracene compounds, pyrene compounds, coronene compounds, quinolone compounds, azaquinolone compounds, pyrazoline derivatives, pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, cyanine compounds, acridine compounds, metal complexes of 8-hydroxyquinoline compounds, metal complexes of 2-bipyridine compounds, complexes of Schiff bases and Group III metals, oxin metal complexes, and rare earth complexes. These materials for luminous layers may be used alone or in the form of mixtures.

The material for hole injection layers refers to a material contained in hole injection layers of organic EL devices. Specifically, examples of the materials for hole injection layers include organic materials, such as phthalocyanine materials, oligoamine materials, dendrimer amine materials, and polythiophene materials; and inorganic materials composed of metal oxides, such as tungsten oxide films. These materials for hole injection layers may be used alone or in the form of mixtures.

The material for electron injection layers refers to a material contained in electron injection layers of organic EL devices. Specifically, examples of usable materials for electron injection layers include organic materials, such as metal chelate materials, phenanthroline materials, oxadiazole materials, and triazole materials; and inorganic materials, such as alkali metal compounds and alkaline earth metal compounds. Examples of inorganic materials usable as the materials for electron injection layers include barium, phthalocyanine, lithium fluoride, and mixtures thereof. These materials for electron injection layers may be used alone or in the form of mixtures.

The material for hole transport layers refers to a material contained in hole transport layers of organic EL devices. Examples of the materials for hole transport layers include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, porphine compounds, aromatic tertiary amine compounds, styrylamine compounds, butadiene compounds, polystyrene derivatives, hydrazone derivatives, triphenylmethane derivatives, and tetraphenylbenzine derivatives. These materials for hole transport layers may be used alone or in the form of mixtures.

The material for electron transport layers refers to a material contained in electron transport layers of organic EL devices. Examples of the materials for electron transport layers include barium, phthalocyanine, lithium fluoride, nitro-substituted fluorenone derivatives, thiopyran dioxide derivatives, diphenoquinone derivatives, perylenetetracarboxyl derivatives, anthraquinodimethane derivatives, fluorenylidenemethane derivatives, anthrone derivatives, oxadiazole derivatives, perinon derivatives, and quinoline complex derivatives. These materials for electron transport layers may be used alone or in the form of mixtures.

The organic EL mixture may contain any organic solvent typically used in the organic EL ink. Examples of the solvent include aromatic solvents, hydrocarbon solvents, halogen solvents, ester solvents, ether solvents, and alcohol solvents.

Examples of the aromatic solvents include benzene, toluene, xylene, mesitylene, ethylbenzene, linear or branched propylbenzene, butylbenzene, pentylbenzene, hexylbenzene, nonyl benzene, decylbenzene, undecylbenzene, dodecyibenzene, tetralin, and cyclohexylbenzene.

Examples of the hydrocarbon solvents include linear and branched, saturated and unsaturated hydrocarbon solvents having 6 or more carbon atoms, such as hexane, heptane, octane, nonane, decane, and undecane.

Examples of the halogen solvents include dichloromethane, dichloroethane, chloroform, carbon tetrachloride, tetrachloroethane, trichloroethane, chlorobenzene, dichlorobenzene, and chlorotoluene.

Examples of the ester solvents include ethyl acetate, butyl acetate, amyl acetate, and octyl acetate.

Examples of the ether solvents include dibutyl ether, tetrahydrofuran, dioxane, anisole, and 3-phenoxytoluene.

Examples of the alcohol solvents include isopropyl alcohol. These solvents may be used alone or in combination.

Oxygen contained in organic EL ink deteriorates the organic EL ink over time, and thus reduces the performance of organic functional layers formed using the organic EL ink. Light or oxidation denatures the organic EL ink, resulting in an undesirably short life of the organic functional layers formed using the organic EL ink. For this reason, the organic EL mixture may further contain at least one of oxygen adsorbents, light stabilizers, and antioxidants. An organic EL mixture further containing at least one of oxygen adsorbents, light stabilizers, and antioxidants can prevent mixing of oxygen in the organic EL ink and denaturing of the organic EL ink by light or oxidation, therefor providing high-quality organic EL ink and organic EL devices having reduced age deterioration.

The organic EL mixture can contain any oxygen adsorbent which does not impair the performance of the organic EL ink. Examples of the oxygen adsorbent which can be contained in the organic EL mixture include hydroquinone derivatives such as hydroquinone-β-D-galactoside, and hydroquinone-β-D-fructoside; catechol derivatives such as 1,2-methylenedioxybenzene, veratrole, guaiacol, and guethol; 1,4-dihydro-9,10-anthraquinone, tetrahydroanthraquinone, alkylanthraquinone, 2-pentenylanthraquinone, 2-pentylanthraquinone, 2-phenoxyanthraquinone, 2-(2-hydroxyethoxy)anthraquinone, ethyl anthraquinonecarboxylate, glycidyl anthraquinonecarboxylate, chloroanthraquinone, and anthraquinone derivatives such as anthraquinonesulfonic acid; reducing sugars such as glucose; reducing alcohols such as ascorbic acid; and organic compounds such as polyvalent phenols. These oxygen adsorbents may be used alone or in the form of mixtures.

In addition of an oxygen adsorbent to the material for a luminous layer, the content of the oxygen adsorbent in the material for a luminous layer is preferably 0.001% by weight or more and 30% by weight or less, particularly preferably 0.1% by weight or more and 10% by weight or less.

The organic EL mixture can contain any light stabilizer which does not impair the performance of the organic EL ink. Examples of the light stabilizer which can be contained in the organic EL mixture include salicylate light stabilizers, benzophenone light stabilizers, benzotriazole light stabilizers, hindered amine light stabilizers, cyano acrylate light stabilizers, oxalic anilide light stabilizers, and nickel quenchers. These light stabilizers may be used alone or in the form of mixtures.

Examples of the salicylate light stabilizers include phenyl salicylate, 4-tert-butyl salicylate, 2,4-di-tert-butylphenyl-3', 5'-di-tert-butyl-4'-hydroxy benzoate, and 4-tert-octylphenyl salicylate.

Examples of the benzophenone light stabilizers include 2,4-dihydroxybenzophenone, 2-hydroxy-4-methoxybenzophenone, 2-hydroxy-4-methoxybenzophenone-5-sulfonic acid, 2-hydroxy-4-n-octoxybenzophenone, 2-hydroxy-4-n-dodecyloxybenzophenone, 2-hydroxy-4-benzyloxybenzophenone, bis(5-benzoyl-4-hydroxy-2-methoxyphenyl)methane, 2,2'-dihydroxy-4-methoxybenzophenone, 2,2'-dihydroxy-4,4'-dimethoxybenzophenone, 2,2',4,4'-tetrahydroxybenzophenone, 4-dodecyloxy-2-hydroxybenzophenone, and 2-hydroxy-4-methoxy-2'-carboxybenzophenone.

Examples of the benzotriazole light stabilizers include 2-(2-hydroxy-5-methylphenyl)benzotriazole, 2-[2-hydroxy-3,5-bis(α,α-dimethylbenzyl)phenyl]benzotriazole, 2-(2-hydroxy-3,5-di-tert-butylphenyl)benzotriazole, 2-(2-hydroxy-3-tert-butyl-5-methylphenyl)-5-chlorobenzotriazole, 2-(2-hydroxy-3,5-di-tert-butylphenyl)-5-chlorobenzotriazole, 2-(2-hydroxy-3,5-di-tert-amylphenyl)benzotriazole, 2-(2-hydroxy-5-tert-octylphenyl)benzotriazole, and 2,2'-methylenebis[4-(1,1,3,3-tetramethylbuty-6-(2 N-benzotriazol-2-yl) phenol].

Examples of the hindered amine light stabilizers include phenyl-4-piperidyl carbonate, bis-[2,2,6,6-tetramethyl-4-piperidyl]sebacate, bis-[N-methyl-2,2,6,6-tetramethyl-4-piperidyl]sebacate, bis-(1,2,2,6,6-pentamethyl-4-piperidyl)-2-(3,5-di-tert-butyl-4-hydroxybenzyl)-2-n-butyl malonate, poly[[6-(1,1,3,3-tetramethylbutyl)imino-1,3,5-triazine-2,4-diyl][(2,2,6,6-tetramethyl-4-piperidyl)imino]hexamethylene [(2,2,6,6-tetramethyl-4-piperidyl)iminol]], tetrakis(2,2, 6,6-tetra-methyl-4-piperidyl)-1,2,3,4-butane-tetracarboxylate, 1,1'-(1,2-ethanediyl)bis(3,3,5,5-tetramethylpiperazinone), polymers of 4-hydroxy-2,2,6,6-tetramethyl-1-piperidine ethanol and dimethyl succinate, (2,2,6,6-tetramethyl-4-piperidyl/tridecyl)-1,2,3,4-butane tetracarboxylate, (1,2,2,6,6-pentamethyl-4-piperidyl/tridecyl)-1,2,3,4-butane tetracarboxylate, [2,2,6,6-tetramethyl-4-piperidyl/β,β,β',β'-tetramethyl-3,9-[2,4,8,10-tetraoxaspiro (5,5)undecane]diethyl]-1,2,3,4-butane tetracarboxylate, and [1,2,2,6,6-pentamethyl-4-piperidyl/β,β,β',β'-tetramethyl-3, 9-[2,4,8,10-tetraoxaspiro(5,5)undecane]diethyl]-1,2,3,4-butane tetracarboxylate.

Examples of the cyano acrylate light stabilizers include ethyl-2-cyano-3,3-diphenyl acrylate, 2-ethylhexyl-2-cyano-3,3'-diphenyl acrylate, and butyl-2-cyano-3-methyl-3-(p-methoxyphenyl)acrylate.

Examples of the oxalic anilide light stabilizers include 2-ethoxy-2'-ethyloxalic bisanilide, and 2-ethoxy-5-tert-butyl-2'-ethyloxalic bisanilide.

Examples of the nickel quenchers include [2,2'-thio-bis (4-tert-octylphenolate)]-2-ethylhexylamine-nickel(II), nickel dibutyl-dithiocarbamate, [2,2'-thiobis(4-tert-octylphenolate)]n-butylamine nickel, nickel bis(octylphenyl)sulfide, 3,5-di-test-butyl-4-hydroxybenzoic monoethylate nickel complexes, and 2,2'-thiobis(4-tert-octylphenolate)triethanolamine nickel(II) complexes.

In addition of a light stabilizer to the material for a luminous layer, the content of the light stabilizer relative to the material for a luminous layer is preferably 0.01% by weight or more and 50% by weight or less, particularly preferably 0.2% by weight or more and 10% by weight or less.

The organic EL mixture can contain any antioxidant which does not impair the performance of the organic EL ink. Examples of the antioxidants which can be contained in the organic EL mixture include phenol antioxidants, aromatic amine antioxidants, organic sulfur antioxidants and organic phosphorus antioxidants. These antioxidants may be used alone or in the form of mixtures.

Examples of the phenol antioxidants include 2,6-di-tert-butylphenol, 2,4-di-tert-butylphenol, 2-tort-butyl-4-methoxyphenol, 2-tert-butyl-4,6-di-methylphenol, 2,6-di-tert-butyl-4-methylphenol, 2,6-di-tert-butyl-4-ethylphenol, 2,4,6-tri-tert-butylphenol, 2,6-di-tert-butyl-4-hydroxy methyl phenol, 2,6-di-tort-butyl-2-dimethylamino-p-cresol, 2,5-di-tert-butylhydroquinone, 2,5-di-tert-amylhydroquinone, n-octadecyl-3-(3',5'-di-tert-butyl-4'-hydroxyphenyl) propionate, 2,4-bis-(n-octylthio)-6-(4-hydroxy-3,5-di-tert-butylanilino)-1,3,5-triazine, phenols substituted by a 1-phenylethyl group, phenols substituted by a 1-phenylethyl group and a methyl group, 2-tert-butyl-6-(3'-tert-butyl-5'-methyl-2'-hydroxybenzyl)-4-methyl phenyl acrylate, 2,2'-methylene-bis-(4-methyl-6-tert-butylphenol), 2,2'-methylene-bis-(4-ethyl-6-tert-butylphenol), 2,2'-methylene-bis-(6-cyclohexyl-4-methylphenol), 2,2'-methylene-bis-[6-(1-methylcyclohexyl)-p-cresol], 2,2'-ethylidene-bis-(2,4-di-tert-butylphenol), 2,2'-butylidene-bis-(2-tert-butyl-4-methylphenol), 4,4'-methylene-bis-(2,6-di-tert-butylphenol), 4,4'-butylidene-bis-(3-methyl-6-tert-butylphenol), 1,6-hexanediol-bis-[3-(3,5-di-tert-butyl-4-hydroxyphenyl)-propionate], tri-ethyleneglycol-bis-[3-(3-tert-butyl-5-methyl-4-hydroxyphenyl)-propionate], N,N'-bis-[3-(3,5-di-tert-butyl-4-hydroxyphenyl)-propionyl]-hydrazine, N,N'-bis-[3-(3,5-di-tert-butyl-4-hydroxyphenyl)-propionyl]-hexamethylenediamine, 2,2'-thio-bis-(4-methyl-6-tert-butylphenol), 4,4'-thio-bis-(3-methyl-6-tert-butylphenol), 2,2'-thio-diethylene-bis-[3-(3,5-di-tert-butyl-4-hydroxyphenyl)-propionate], bis[2-tert-butyl-4-methyl-6-(3-tert-butyl-5-methyl-2-hydroxybenzyl)-phenyl] terephthalate, 1,1,3-tris-(2-methyl-4-hydroxy-5-tert-butylphenyl)-butane, 1,3,5-trimethyl-2,4,6-tris-(3,5-di-tert-butyl-4-hydroxybenzyl)-benzene, tris(3,5-di-tert-butyl-4-hydroxybenzyl)-isocyanurate, tris[2-(3,5-di-tert-butyl-4-hydroxyhydro-cinnamayloxy)ethyl]isocyanurate, tris(4-tert-butyl-2,6-di-methyl-3-hydroxybenzyl)-isocyanurate, tetrakis-[methylene-3-(3,5-di-tert-butyl-4-hydroxyphenyl) propionate]-methane, calcium bis-[ethyl-(3,5-di-tert-butyl-4-hydroxybenzyl)-phosphate], propyl-3,4,5-tri-hydroxybenzene carbonate, octyl-3,4,5-tri-hydroxybenzene carbonate, dodecyl-3,4,5-tri-hydroxybenzene carbonate, 2,2'-methylene-bis-(4-methyl-6-tert-butylphenal), 4,4'-methylene-bis-(2,6-di-tert-butylphenol), 1,1-bis-((4-hydroxy-phenyl)-cyclohexane, 1,1,3-tris-(2-methyl-4-hydroxy-5-tertbutylphenyl)-butane, 1,3,5-trimethyl-2,4,6-tris-(3,5-di-tert-butyl-4-hydroxybenzyl)benzene, and 3,9-bis[1,1-di-methyl-2-[β-(3-tert-butyl-4-hydroxy-5-methylphenyl)propionyloxy]ethyl]-2,4,8,10-tetraoxaspiro[5,5]undecane.

Examples of the aromatic amine antioxidants include 4,4'-dioctyl-diphenylamine, diphenylamine substituted by an alkyl group, N,N'-diphenyl-p-phenylenediamine, N,N'-diaryl-p-phenylenediamine, 6-ethoxy-2,2,4-trimethyl-1,2-dihydroquinoline, N-phenyl-N'-isopropyl-p-phenylenediamine, N-phenyl-N'-1,3-dimethylbutyl-p-phenylenediamine, 2,2,4-trimethyl-1,2-dihydroquinoline polymers, aldol-1-naphthylamine, N-phenyl-2-naphthylamine, and N,N'-di-2-naphthyl-p-phenylenediamine, Examples of the organic sulfur antioxidants include dilauryl-3,3'-thiodipropionate, ditridecyl-3,3'-thiodipropionate, dimyristyl-3,3'-thiodipropionate, distearyl-3,3'-methyl-3,3'-thiodipropionate, bis[2-methyl-4-[3-n-alkylthiopropionyloxy]-5-tert-butylphenyl]sulfide, pentaerythrityl-tetrakis-(3-laurylthiopropionate), 2-mercaptobenzimidazole, and 2-mercapto-5-methylbenzimidazole.

Examples of the organic phosphorus antioxidants include tris(isodecyl) phosphate, tris(tridecyl) phosphate, phenyldiisooctyl phosphate, phenyldiisodecyl phosphate, phenyldi(tridecyl) phosphate, diphenylisooctyl phosphate, diphenylisodecyl phosphate, diphenyltridecyl phosphate, phosphorous acid [1,1'-biphenyl-4,4'-diylbistetrakis[2,4-bis-(1,1-dimethylethyl)phenyl]]ester, triphenyl phosphate, tris(nonylphenyl) phosphate, 4,4'-isopropylidene-diphenolalkyl phosphate, tris(2,4-di-tert-butylphenyl)-phosphate, tris(biphenyl) phosphate, distearylpentaerythritol diphosphate, di(2,4-di-tert-butylphenyl)pentaerythritol diphosphate, di(nonylphenyl)pentaerythritol diphosphate, phenyl-bisphenol-pentaerythritol diphosphate, tetratridecyl-4,4'-butylidene bis(3-methyl-6-tert-butylphenol)-diphosphate, hexatridecyl-1,1,3-tris-(2-methyl-4-hydroxy-5-tert-butylphenyl)butane triphosphate, 3,5-di-tert-butyl-4-hydroxybenzylphosphate-di-ethyl ester, 9,10-dihydro-9-oxa-10-phosphaphenanthrene 10-oxide, sodium bis(4-tert-butylphenyl) phosphate, sodium-2,2'-methylene-bis(4,6-di-tert-butylphenyl)phosphate, and 1,3-bis(diphenoxyphosphonyloxy)-benzene.

In addition of an antioxidant to the material for a luminous layer, the content of the antioxidant relative to the material for a luminous layer is preferably 0.01% by weight or more and 50% by weight or less, particularly preferably 0.2% by weight or more and 10% by weight or less.

Embodiment 2

Figure 2:
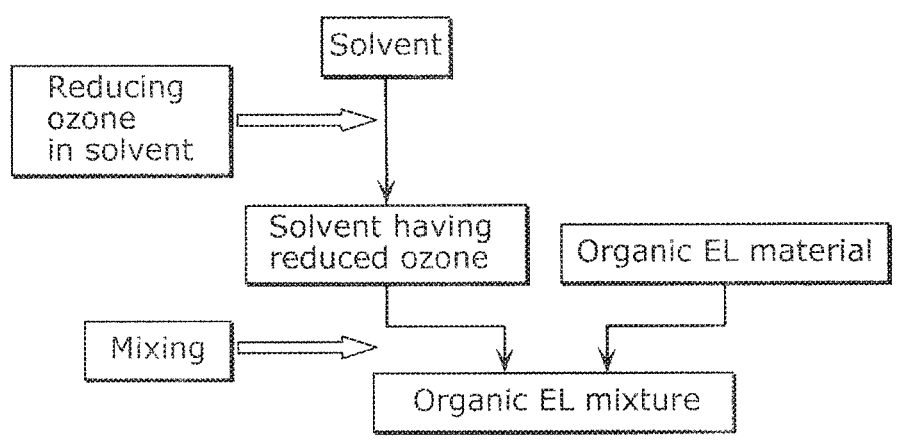
FIG. 2 illustrates a flow of a method of producing an organic EL ink according to Embodiment 2.

FIG. 2 illustrates a flow of a method of producing an organic EL ink according to Embodiment 2. As illustrated in FIG. 2, the method of producing an organic EL ink according to Embodiment 2 includes a step of reducing ozone contained in a solvent, and a step of mixing a solvent obtained through the step of reducing ozone in the solvent with an organic EL material to prepare an organic EL mixture.

Throughout the specification, the term "reducing ozone contained in a solvent" refers to a reduction in content of ozone in a solvent, for example.

The method of producing an organic EL ink according to Embodiment 2 can produce an organic EL ink with a solvent having a reduced content of ozone, and thus can a high-quality organic EL ink having reduced age deterioration. Specifically, the method of producing an organic EL ink according to Embodiment 2 can yield an organic EL ink containing 0.0005 ppm or less ozone.

Examples of the step of reducing ozone contained in a solvent include a step of treating a solvent with an ozone adsorbent to reduce the ozone contained in the solvent.

Examples of the ozone adsorbent usable in the present embodiment include zeolite, silica gel, alumina, and activated carbon. These ozone adsorbents may be used alone or in the form of mixtures.

Examples of the method of treating a solvent with an ozone adsorbent include a method of treating a solvent through a column carrying an ozone adsorbent, and a method of dispersing an ozone adsorbent in a solvent once, and removing the ozone adsorbent from the solvent through filtration. The present embodiment is advantageous because the ozone contained in the solvent can be reduced by such a simple method.

The solvents and the organic EL materials are the same as those listed in Embodiment 1 above.

In the mixing step, at least one of oxygen adsorbents, light stabilizers, and antioxidants may be further mixed with the solvent and the organic EL material to prepare an organic EL mixture. An organic EL mixture further containing at least one of oxygen adsorbents, light stabilizers, and antioxidants can yield a high-quality organic EL ink having reduced age deterioration.

The oxygen adsorbents, the light stabilizers, and the antioxidants are the same as those listed in Embodiment 1 above.

Modification

Figure 3:
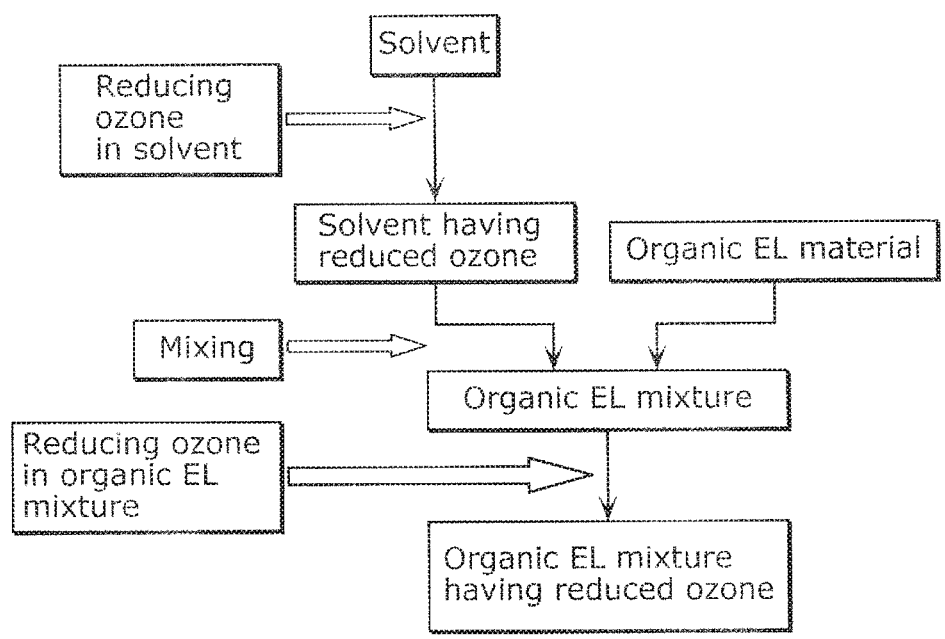
FIG. 3 illustrates a flow of a modification of the method of producing an organic EL ink according to Embodiment 2.
Figure 4:
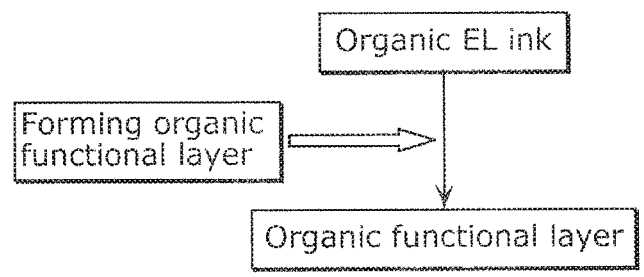
FIG. 4 illustrates a flow of a method of manufacturing an organic EL device according to one embodiment of the present disclosure.

FIG. 3 illustrates a flow of a modification of the method of producing an organic EL ink according to Embodiment 2. As illustrated in FIG. 3, the method of producing an organic EL ink according to the present modification further includes a step of reducing ozone contained in an organic EL mixture after the mixing step.

The step of reducing ozone in the organic EL mixture in the present modification may be the same as the step of reducing ozone contained in an organic EL mixture in Embodiment 1.

In other words, examples of the step of reducing ozone in the organic EL mixture in the present modification include a step of treating an organic EL mixture with an ozone adsorbent to reduce the ozone contained in the organic EL mixture.

Since the method of producing an organic EL ink according to the present modification reduces the ozone contained in the solvent, and thus further reduces the ozone contained in the organic EL mixture, the content of the ozone in the organic EL ink can be more significantly reduced. Specifically, the ozone originally contained in the organic EL material and the ozone inevitably mixed with the organic EL mixture during the mixing step can be removed from the organic EL mixture through the step of reducing ozone in the organic EL mixture. As a result, the method of producing an organic EL ink according to the present modification can provide a high-quality organic EL ink having further reduced age deterioration. Specifically, the method of producing an organic EL ink according to the present modification can yield an organic EL ink containing 0.0001 ppm or less ozone.

Method of Manufacturing Organic EL Device

The method of manufacturing an organic EL device according to the present embodiment includes an organic functional layer forming step of forming an organic functional layer using an organic EL ink prepared by the method of producing an organic EL ink according to Embodiment 1 or Embodiment 2.

An Organic functional layer may be formed using the organic EL ink as follows: An organic EL ink is applied into a film by an application method, such as dispenser coating, nozzle coating, spin coating, intaglio printing, or relief printing, and the film is dried into an organic functional layer.

Throughout the specification, the term "organic functional layer" refers to one of a luminous layer, a hole injection layer, an electron injection layer, a hole transport layer, and an electron transport layer.

The organic EL device refers to, but should not be limited to, an organic EL display device, for example. The organic EL device may be an organic EL lighting. The method of manufacturing an organic EL device according to the present embodiment can provide an organic functional layer having a reduced ozone content. As a result, the method of manufacturing an organic EL device according to the present embodiment can provide high-quality organic EL devices having reduced age deterioration.

The method of producing an organic EL ink and the method of manufacturing an organic EL device according to the embodiments of the present disclosure have been described, but these embodiments should not be construed as limitation on the present disclosure. In other words, the embodiments disclosed herein are illustrative in all respects, and should not be construed. The scope of the present disclosure is indicated by the scope of Claims but not the description above, and it is intended that meaning equivalent to the scope of Claims and changes within the scope are included.

For example, the step of reducing ozone in the organic EL mixture, the step of reducing ozone in the solvent, and the mixing step may be performed under an inert gas atmosphere. Throughout the specification, the term "inert gas" refers to a gas which barely changes the performance of the organic EL ink, such as nitrogen, argon, neon, helium, krypton, or xenon gas. The term "under an inert gas atmosphere" refers to an atmosphere containing 99% or more inert as. The step of reducing ozone in the organic EL mixture, the step of reducing ozone in the solvent, and the mixing step performed under an inert gas atmosphere can reduce the age deterioration of the resulting organic EL ink and organic EL devices.

In the step of reducing ozone in the organic EL mixture, the ozone adsorbent is preferably added in an amount of 0.01% by weight to 100% by weight, more preferably 0.1% by weight to 10% by weight relative to 100% by weight of the organic EL mixture. In the case where besides the ozone adsorbent, an oxygen adsorbent, an antioxidant, and a light stabilizer are added in the step of reducing ozone in the organic EL mixture, the amounts of the oxygen adsorbent, the antioxidant, and the light stabilizer to be added are preferably 0.01% by weight to 100% by weight, more preferably 0.1% by weight to 10% by weight relative to 100% by weight of the organic EL mixture.

In the step of reducing ozone in the solvent, the ozone adsorbent is preferably added 0.01% by weight to 100% by weight, more preferably 0.1% by weight to 10% by weight relative to 100% by weight of the solvent. In the case where besides the ozone adsorbent, an oxygen adsorbent, an antioxidant, and a light stabilizer are added in the step of reducing ozone in the solvent, the amounts of the oxygen adsorbent, the antioxidant, and the light stabilizer to be added are preferably 0.01% by weight to 100% by weight, more preferably 0.1% by weight to 10% by weight relative to 100% by weight of the solvent.

In addition of the ozone adsorbent, the oxygen adsorbent, the antioxidant, and the light stabilizer to the solvent, the oxygen adsorbent, the antioxidant, and the light stabilizer can be added to the solvent, followed by addition of the ozone adsorbent. Note that the ozone adsorbent, the oxygen adsorbent, the antioxidant, and the light stabilizer can be added to the solvent in any other order.

The step of reducing ozone in the organic EL mixture and the step of reducing ozone in the solvent may be performed without the ozone adsorbent.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is useful as a method of producing an organic EL ink and a method of manufacturing an organic EL device.

The invention claimed is:

1. A method of producing an organic electroluminescent ink, the method comprising:
   reducing the content of ozone contained in a solvent to form an ozone-reduced solvent; and
   mixing,
      the ozone-reduced solvent, with
      an organic electroluminescent material
   to prepare an organic electroluminescent mixture.

2. The method of producing an organic electroluminescent ink according to claim 1,
   wherein, in the reducing of the content of ozone contained in the solvent, the solvent is treated with an ozone adsorbent to reduce the content of the ozone contained in the solvent.

3. The method of producing an organic electroluminescent ink according to claim 1, further comprising
   reducing the content of ozone contained in the organic electroluminescent mixture after the mixing.

4. The method of producing an organic electroluminescent ink according to claim 3,
   wherein, in the reducing the content of the ozone contained in the organic electroluminescent mixture, the organic electroluminescent mixture is treated with an ozone adsorbent to reduce the content of ozone contained in the organic electroluminescent mixture.

5. The method of producing an organic electroluminescent ink according to claim 1,
   wherein, in the mixing, at least one of
      oxygen adsorbents,
      light stabilizers, and
      antioxidants
   is further mixed in to prepare the organic electroluminescent mixture.

6. The method of producing an organic electroluminescent ink according to claim 1,
   wherein the organic electroluminescent material is one of a material for a luminous layer, a material for a hole injection layer, a material for an electron injection layer, a material for a hole transport layer, and a material for an electron transport layer.

7. A method of manufacturing an organic electroluminescent device, comprising
forming an organic functional layer using the organic electroluminescent ink yielded by the method of producing an organic electroluminescent ink according to claim 1.

* * * * *